United States Patent
Wang et al.

(10) Patent No.: US 12,080,545 B2
(45) Date of Patent: Sep. 3, 2024

(54) SHOWERHEAD ASSEMBLY AND METHOD OF SERVICING ASSEMBLY FOR SEMICONDUCTOR MANUFACTURING

(71) Applicant: TAIWAN SEMICONDUCTOR MANUFACTURING COMPANY, LTD., Hsinchu (TW)

(72) Inventors: Po-Wei Wang, Hsinchu (TW); Chao-Hsing Lai, Hsinchu (TW); Hsiao-Feng Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/228,201

(22) Filed: Jul. 31, 2023

(65) Prior Publication Data
US 2023/0377871 A1     Nov. 23, 2023

Related U.S. Application Data

(62) Division of application No. 17/459,672, filed on Aug. 27, 2021, now Pat. No. 11,769,659.

(51) Int. Cl.
*H01L 21/02*     (2006.01)
*C23C 16/455*    (2006.01)

(52) U.S. Cl.
CPC .. *H01L 21/02052* (2013.01); *C23C 16/45565* (2013.01); *H01L 21/02057* (2013.01)

(58) Field of Classification Search
CPC ......... H01L 21/02052; H01L 21/02057; C23C 16/45565

(Continued)

(56) References Cited

U.S. PATENT DOCUMENTS

| 7,883,601 B2 | 2/2011 | Chang et al. |
| 2003/0010452 A1* | 1/2003 | Park ............... C23C 16/45565 |
| | | 156/345.33 |

(Continued)

OTHER PUBLICATIONS

Notice of Allowance issued in U.S. Appl. No. 17/459,672, dated May 19, 2023.

(Continued)

*Primary Examiner* — Rudy Zervigon
(74) *Attorney, Agent, or Firm* — STUDEBAKER & BRACKETT PC

(57) ABSTRACT

A method, comprising: providing an adjustable distributor assembly disposed within a showerhead configured to provide selectively adjustable openings through which a cleaning material passes; determining an initial value of a configurable parameter of an adjustable distributor assembly; performing an amount/thickness measurement of a layer including polymeric residues and metal oxide deposits at a cleaning surface of a wafer by a monitoring device; determining whether a variation in the amount/thickness measurement is within an acceptable range; and in response to the variation in the amount/thickness measurement that is not within the acceptable range, automatically adjusting the configurable parameter of the adjustable distributor assembly to set the variation in the amount/thickness measurement within the acceptable range so that the cleaning material that passes through the selectively adjustable openings of the adjustable distributor assembly reduces metal oxide deposits.

20 Claims, 17 Drawing Sheets

(58) Field of Classification Search
USPC .......... 118/715; 156/345.33, 345.34; 216/67, 216/68, 69, 70, 71
See application file for complete search history.

(56) References Cited

U.S. PATENT DOCUMENTS

| | | |
|---|---|---|
| 2004/0082251 A1 | 4/2004 | Bach et al. |
| 2006/0102286 A1* | 5/2006 | Kim .................... C23C 16/507 156/345.35 |
| 2013/0098293 A1 | 4/2013 | Lee et al. |

OTHER PUBLICATIONS

Non-Final Office Action issued in U.S. Appl. No. 17/459,672, dated Jan. 18, 2023.

* cited by examiner

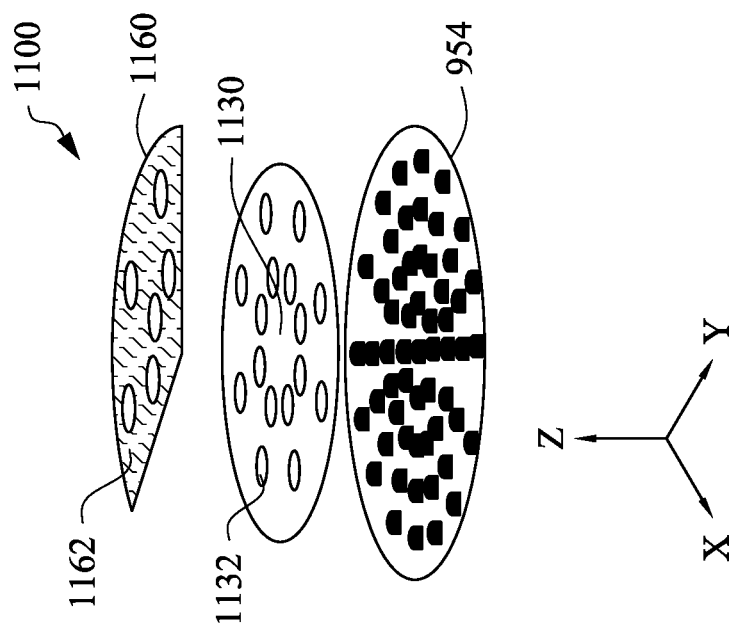
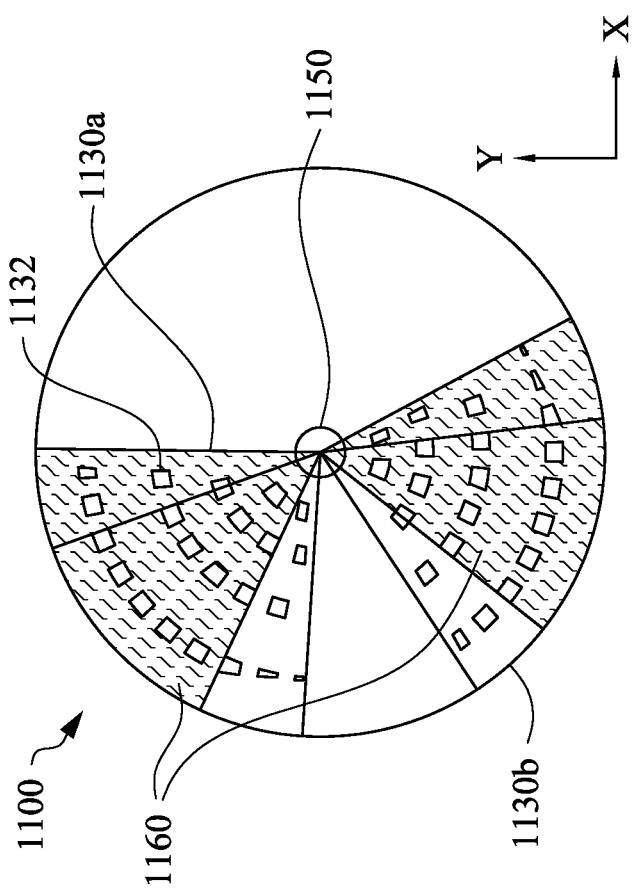
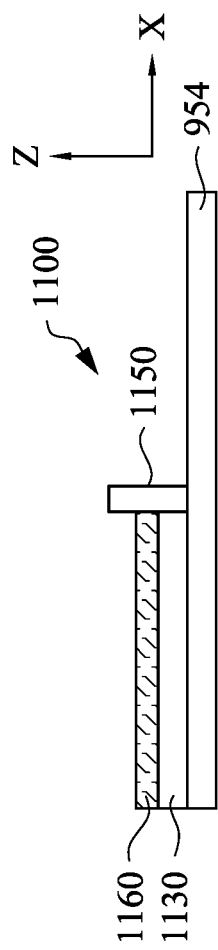
FIG. 3C
FIG. 3A
FIG. 3B

SHOWERHEAD ASSEMBLY AND METHOD OF SERVICING ASSEMBLY FOR SEMICONDUCTOR MANUFACTURING

CROSS REFERENCE TO RELATED APPLICATION

This Application is a Divisional application of U.S. Ser. No. 17/459,672, filed Aug. 27, 2021, the disclosure of which is incorporated herein by reference in entirety.

BACKGROUND

In a semiconductor manufacturing process, uniformity of processes is a key factor to improve the production yield and reliability of produced devices. In particular, in vapor phase processes or plasma processes using a showerhead to introduce gases into a chamber, maintaining or improving uniformity of the gases is one of the key factors to improve process uniformity.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3A, 3B, 3C, 3D, 3E and 3F schematically illustrate adjustable distributor assemblies including a plurality of control sheets according to various embodiments of the disclosure.

DETAILED DESCRIPTION

It is to be understood that the following disclosure provides many different embodiments, or examples, for implementing different features of the disclosure. Specific embodiments or examples of components and arrangements are described below to simplify the present disclosure. These are, of course, merely examples and are not intended to be limiting. For example, dimensions of elements are not limited to the disclosed range or values, but may depend upon process conditions and/or desired properties of the device. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. In addition, the term "made of" may mean either "comprising" or "consisting of."

The present disclosure relates to an adjustable showerhead assembly that is designed to improve process (e.g., etching or deposition) uniformity of an etching or a deposition apparatus. In some embodiments, the apparatus is for a pre-clean process of a metal surface, e.g., a Cu or Cu alloy surface to remove polymeric residues and reduce metal oxide deposits, such as copper oxide, before forming a subsequent conductive layer.

Figure 1:
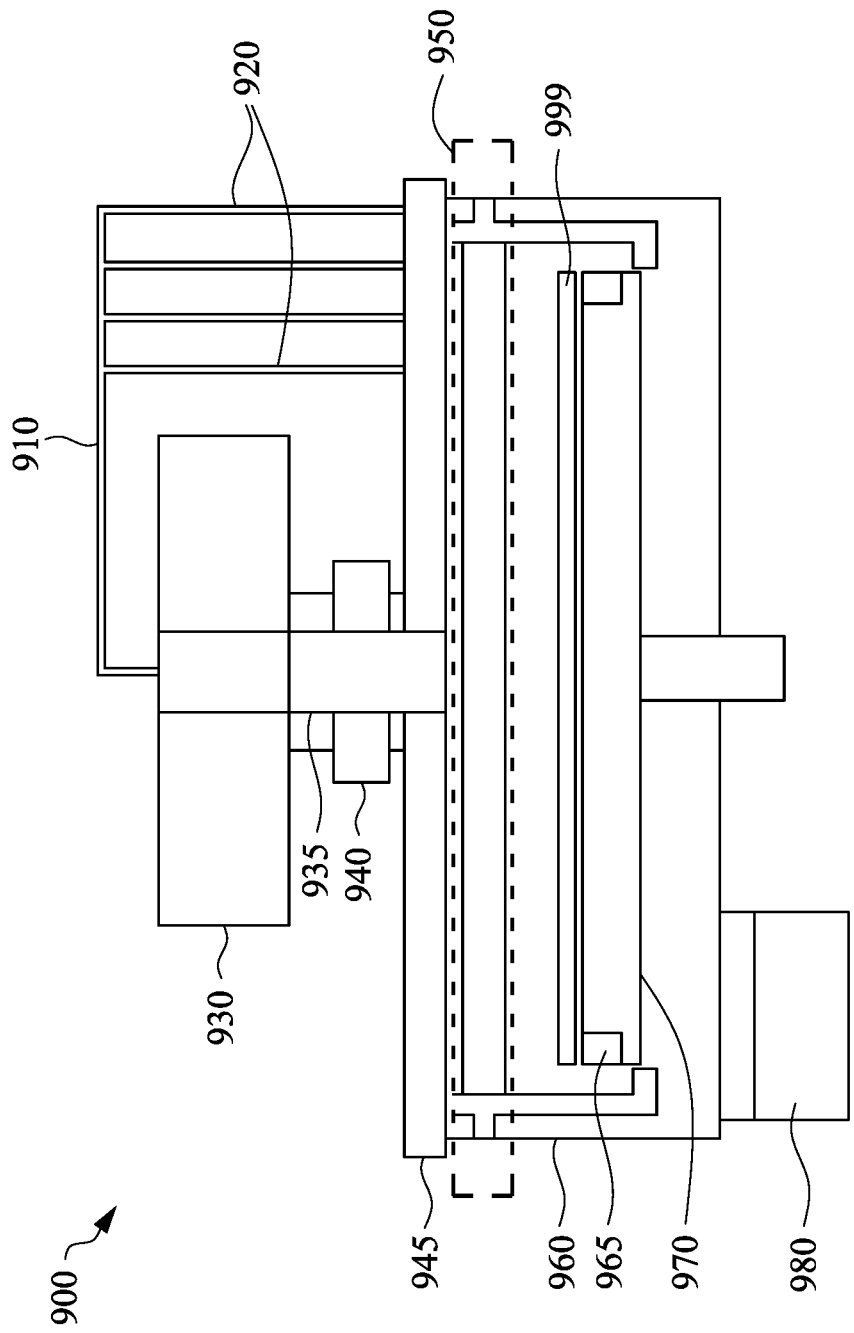
FIG. 1 schematically illustrates a pre-clean system and a showerhead used for a semiconductor wafer manufacturing process, according to embodiments of the disclosure.

FIG. 1 schematically illustrates a pre-clean system 900 and a showerhead 950 used for a semiconductor wafer manufacturing process, according to embodiments of the disclosure. As shown in FIG. 1, the pre-clean system 900 includes a flow inlet 910 that passes pre-cleaning material 920 to a remote plasma source 930. In some embodiments, the pre-cleaning material 920 includes at least one of helium gas, $H_2O$, argon gas, and hydrogen gas. In some embodiments, a substrate 999, on which conductive patterns (e.g., Cu wiring patterns) are formed, is placed on a pedestal 970 and the activated pre-cleaning material 920 (radicals) activated by the remote plasma source 930 enters into the chamber 960 through a showerhead 950.

In some embodiments, the activated remote plasma source 930 of the pre-clean system 900 provides hydrogen ion/radicals. The pre-clean system 900 further includes an applicator tube 935 and an ion filter 940. The applicator tube 935 of the pre-clean system 900 is connected between the remote plasma source 930 and the cleaning chamber 960. The ion filter 940 of the pre-clean system 900 is disposed on the applicator tube 935 and located between the remote plasma source 930 and the cleaning chamber 960, and is used to filter ions in the applicator tube 935.

In some embodiments, the plasma is generated and exists within the remote plasma source 930, and the generated plasma does not enter into the cleaning chamber 960, but reactive hydrogen radicals H* are generated by the remote plasma source 930 and enter into the cleaning chamber 960 through the applicator tube 935, which passes through an aluminum lid 945. Only radicals (i.e., hydrogen radicals H*) enter the cleaning chamber 960, not the plasma, in some embodiments.

In some embodiments, the cleaning chamber 960 of the pre-clean system 900 includes a pedestal (or a stage or a substrate holder) 970, a heating element (e.g., heater) 965, and a showerhead 950. The pedestal 970 of the pre-clean system 900 is located within the cleaning chamber 960, and is used to support a wafer or substrate 999. The heating element 965 of the pre-clean system 900 is located within the pedestal 970, and is used to heat the pedestal 970 to a predetermined temperature. The pedestal 970 heated by the heating element 965 of the cleaning chamber 960 helps increase the process efficiency, e.g., increase the etching rate. The showerhead 950 of the pre-clean system 900 is located within the cleaning chamber 960 and is disposed over the wafer or substrate 999. The hydrogen ions/radicals are generated by the remote plasma source 930 and pass through the showerhead 950 and proceed onto the cleaning surface of the wafer or substrate 999. The hydrogen radicals H* that pass through the showerhead 950 remove polymeric residues on the wafer or substrate 999 and reduce metal oxide deposits, such as copper oxide, deposited on the Cu wiring patterns formed on the wafer or substrate 999 in some embodiments.

In some embodiments, the cleaning chamber 960 of the pre-clean system 900 further includes a turbo pump, a pendulum valve, a radio frequency (RF) resonator, RF cables and a bell jar.

Figure 2:
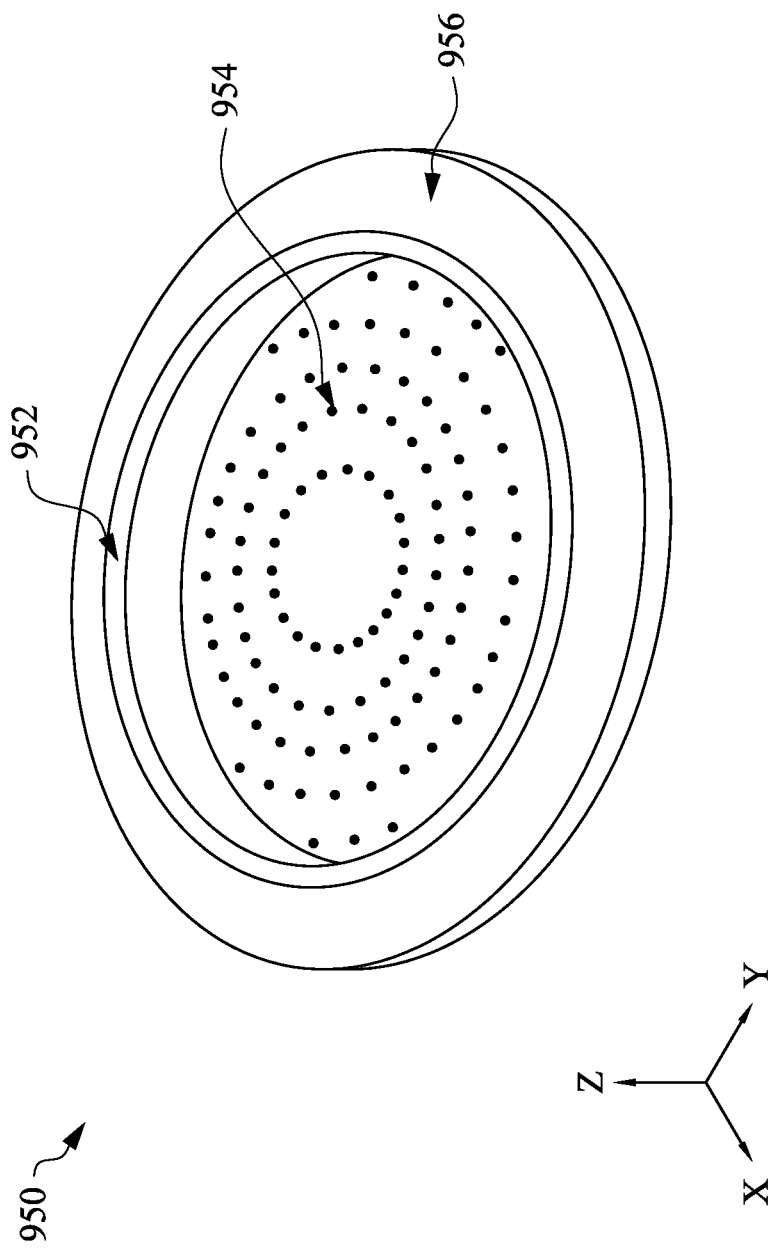
FIG. 2 illustrates a showerhead according to an embodiment of the disclosure.

FIG. 2 is an isometric view of the showerhead 950 that includes the showerhead distributor 954 where an inert gas flow is ejected through the showerhead distributor 954 in various embodiments. In some embodiments, a substrate 999 (shown in FIG. 1) is placed on the pedestal 970 (shown in FIG. 1), then the pre-cleaning material 920, such as a hydrogen gas, flows through the flow inlet 910 and passes through the showerhead 950. The radicals of pre-cleaning material 920 subsequently impinge on the substrate 999 through openings in the face of the showerhead distributor 954 opposing the substrate 999.

As shown in FIG. 2, the showerhead 950 includes a gasket material 952, the showerhead distributor 954, and the showerhead housing 956, in some embodiments. The showerhead distributor 954 is a circular plate having a plurality of through holes, and located within the showerhead housing 956 of the showerhead 950. In some embodiments, a gasket material 952 seals the showerhead housing 956 and prevents the pre-cleaning material 920 from evacuating from the showerhead 950. The gasket material 952, according to embodiments of the disclosure, is made of PE (polyethylene) or PTFE (polytetrafluoroethylene). In some embodiments, the gasket material 952 is made of an elastic material. Examples of the elastic material forming the gasket material 952 include crosslinked rubber materials such as silicone rubber, chloroprene rubber, EPDM, NBR, natural rubber, and fluororubber. In some embodiments, some examples of the silicone rubber include (meth)acryloyloxy group-containing polysiloxane, vinyl polysiloxane, mercaptoalkyl group-containing polysiloxane, and the like.

The showerhead is one of the key parts for the uniform pre-cleaning process. The process uniformity of the pre-cleaning depends on the openings' size in the showerhead distributor. However, it is typical that the showerhead distributor includes a plurality of openings (through holes) that have only one fixed opening size. When thickness uniformity of the processed substrate during the pre-clean operation out of a specified tolerance range, the only way to conventionally solve the problem is to replace the showerhead with another showerhead. As such, there is a need for new configuration of a showerhead, which eliminates the need to replace the showerhead.

Embodiments of the present disclosure are directed to a tunable/controllable showerhead assembly that is designed for selectively adjusting gas flow amounts toward the shower head so that process uniformity is maintained or improved during a pre-clean operation.

As shown in FIGS. 3A, 3B and 3C, in some embodiments according to this disclosure, the showerhead assembly includes an adjustable distributor assembly 1100 disposed above the shower head distributor 954, a gasket material 952, and the showerhead housing 956. FIG. 3A is a plan view of adjustable distributor assembly 1100 in the X-Y plane, and FIG. 3B is a cross sectional view of adjustable distributor assembly 1100 in the X-Z plane. FIG. 3C is an isometric view of the showerhead assembly.

The adjustable distributor assembly 1100, as shown in FIGS. 3A-3C, includes a base sheet 1130 and a plurality of control sheets 1160. In some embodiments, as shown in FIG. 3A, the base sheet 1130 includes a plurality of base sheets 1130a, 1130b. Each of the plurality of base sheets includes base openings 1132 and has a fan shape having an interior angle in a range from about 10 degrees to about 180 degrees in some embodiments. In other embodiments, as shown in FIG. 3C, the base sheet 1130 is a circular plate having base openings 1132. The base sheet 1130 includes base openings 1132 (shown in FIG. 3C). In some embodiments, each of the plurality of control sheets 1160 also includes control openings 1162 and has a fan shape having an interior angle in a range from about 10 degrees to about 180 degrees. In some embodiments, the adjustable distributor assembly 1100 further includes a sheet adapter 1150 that is configured to attach the plurality of control sheets 1160 to the base sheet 1130. Each of the plurality of control sheets 1160 is rotatably coupled to the sheet adapter 1150 about a pivot point of the fan shape. The adjustable distributor assembly 1100 is disposed within the showerhead housing 956 (shown in FIG. 2) of the showerhead. In some embodiments, the base sheet 1130 is not used and the control sheet 1160 is disposed directly on or above the showerhead distributor 954 (shown in FIG. 2). In some embodiments, the base sheet 1130 is in contact with the showerhead distributor 954 and in other embodiments, there is a space (e.g., about 1 mm to about 20 mm) between the base sheet 1130 and the showerhead distributor 954. In some embodiments, the base sheet 1130 is in contact with the control sheet 1160 and in other embodiments, there is a space (e.g., about 0.1 mm to about 5 mm) between the base sheet 1130 and the control sheet 1160.

Figure 3F:
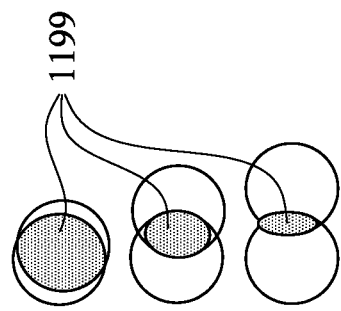
Figure 3E:
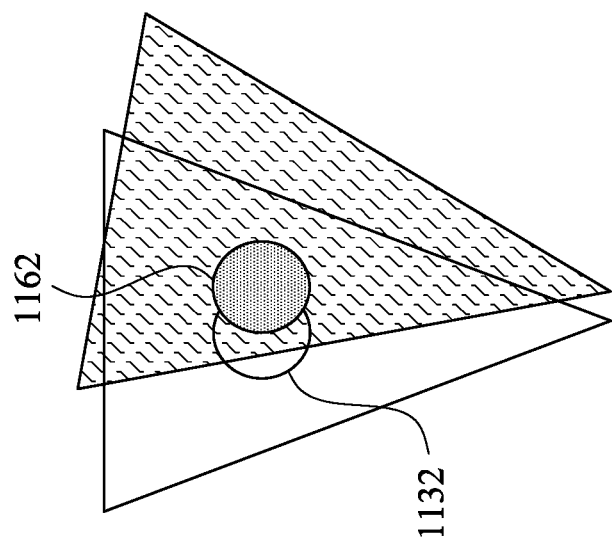
Figure 3D:
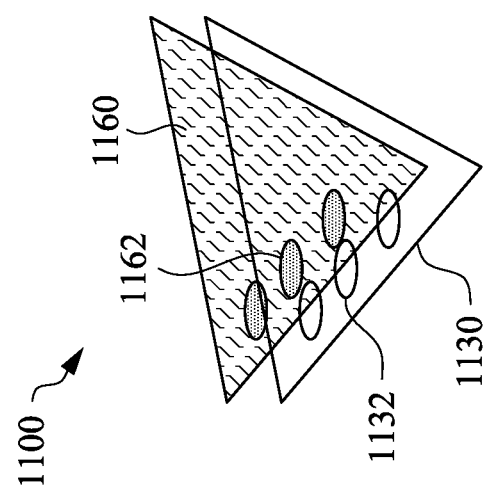

For example, as shown in FIG. 3D, the control openings 1162 of the plurality of control sheets 1160 and the base openings 1132 of the base sheet 1130 have the same diameter. In some embodiments, as shown in FIG. 3E, the adjustable distributor assembly 1100 may rotate and/or move plurality of control sheets 1160, so that the control openings 1162 of the plurality of control sheets 1160 slidably cover the base openings 1132 of the base sheet 1130 to provide selectively adjustable openings 1199, as shown in FIG. 3F. Here, "selectively adjustable" means overlapping opening size and/or regions that are adjustable within the showerhead by slidably mating a base opening and a control opening selected by a user, thereby adjusting an amount of gas passing through the adjustable distributor assembly.

Figure 4B:
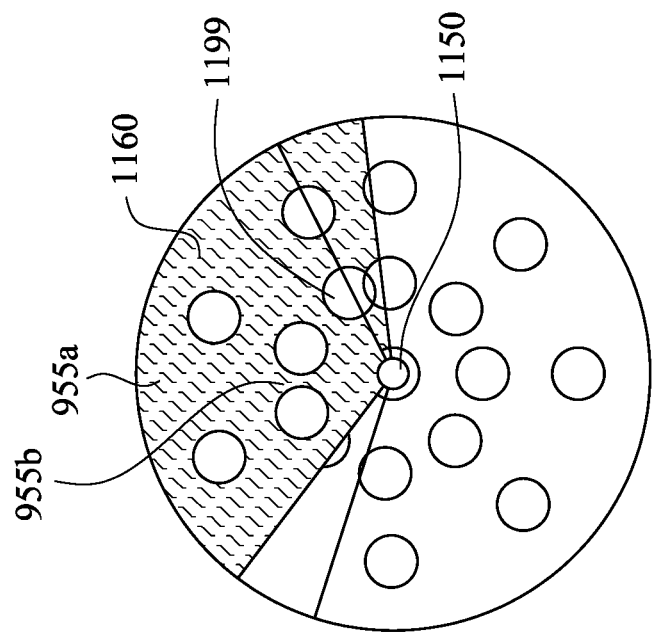
FIGS. 4A, 4B and 4C are schematic views of a base sheet and the plurality of control sheets configured to provide selectively adjustable regions, respectively, according to various embodiments of the disclosure.
Figure 4A:
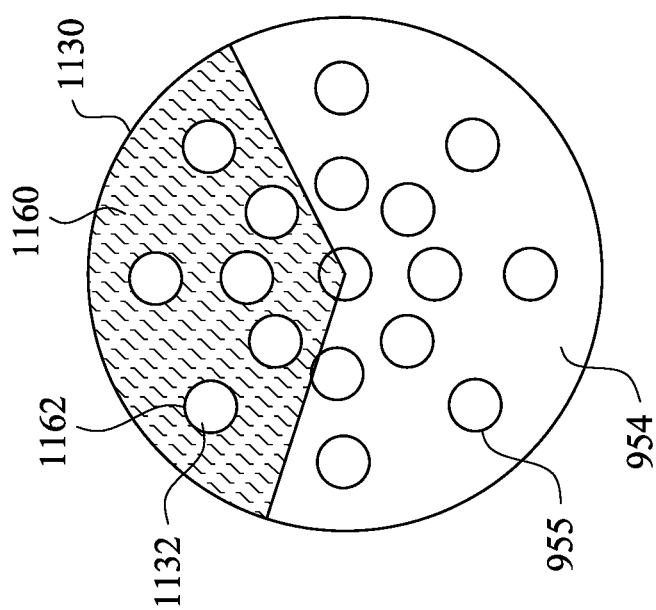
Figure 4C:
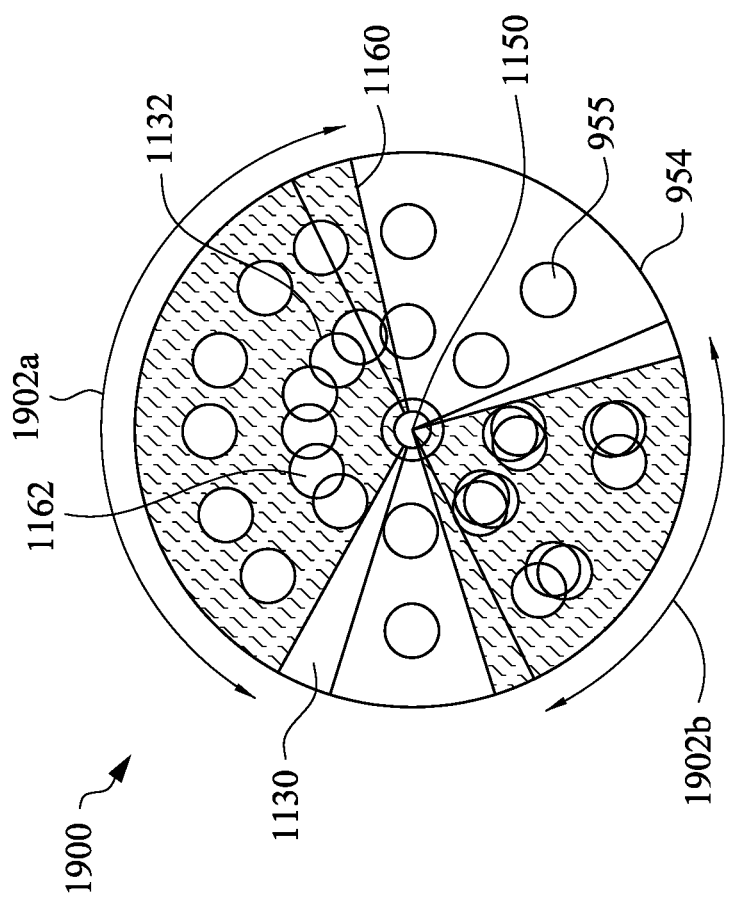

FIGS. 4A, 4B and 4C are schematic views of the base sheet and the plurality of control sheets configured to provide selectively adjustable regions, respectively, according to various embodiments of the disclosure. As shown in FIGS. 4A and 4B, in some embodiments, the plurality of control sheets 1160 is configured to slidably mate with the base sheet 1130 to provide selectively adjustable openings 1199 (shown in FIG. 4B). In some embodiments, the sheet adapter 1150 (shown in FIG. 4B) connects the plurality of control sheets 1160 and the base sheet 1130 together.

As shown in FIG. 4A, in some embodiments, the control openings 1162 of the plurality of control sheets 1160 and the base openings 1132 of the base sheet 1130 (and a distributor opening 955 of the showerhead distributor 954 in some embodiments) have the same diameter (or opening area). In some embodiments, the adjustable distributor assembly 1100 includes the plurality of control sheets 1160 that overlaps the base sheet 1130 above the top of the showerhead distributor 954, such that an overlapping amount of the control openings 1162 of the plurality of control sheets 1160 and the base openings 1132 of the base sheet 1130 (and the distributor opening 955 of the showerhead distributor 954) is 100%. In such embodiments, there is no intersecting area among the openings 1162, 1132, 954.

As shown in FIG. 4B, by adjusting the position of the plurality of control sheets 1160 relative to the base sheet 1130, the overlapping amount of the base openings 1132 and the control openings 1162 can be adjusted from 0% to 100%, thereby adjusting an amount of gas passing through the adjustable distributor assembly 1100. For example, while the base opening 1132 is fully covered and closed by one or more of the plurality of control sheets 1160, the base opening 1132 can be partially covered by one or more of the plurality of control sheets 1160, thereby locally controlling gas flow amounts passing through the adjustable distributor assembly 1100. In some embodiments, each of the plurality of control sheets 1160 makes a rotational movement (around the sheet adapter 1150), and in other embodiments, each of the plurality of control sheets 1160 slidably moves in one or more linear directions. As shown in FIGS. 4A-4C, only the plurality of control sheets 1160 and the base sheet 1130 provide locally different gas flow amounts towards the shower head distributor 954 in some embodiments. As such, in this configuration, a size of the distributor opening 955 of the showerhead distributor 954 does not affect a performance of the adjustable distributor assembly 1100.

FIG. 4C is a schematic view of the base sheet 1130 and the plurality of control sheets 1160 configured to provide selectively adjustable regions 1900 according to an embodiment of the disclosure. As shown in FIG. 4C, the selectively adjustable regions 1900 includes overlapping regions 1902a, 1902b that are adjustable within the showerhead by slidably mating the base openings 1132 and the control openings 1162 through an angle from 0 degree to 360 degrees, thereby adjusting an amount of gas passing through the adjustable distributor assembly 1100. In some embodiments, the sheet adapter 1150 connects the plurality of control sheets 1160 and the base sheet 1130 together. In some embodiments, each of the plurality of control sheets 1160 makes a rotational movement (around the sheet adapter 1150 shown in FIG. 3C), and in other embodiments, each of the plurality of control sheets 1160 slidably moves in one or more linear directions. In some embodiments, an angular spacing between the base openings 1132 and the control openings 1162 in the angular direction and the angular spacing in the radial direction are taken into consideration.

Figure 5B:
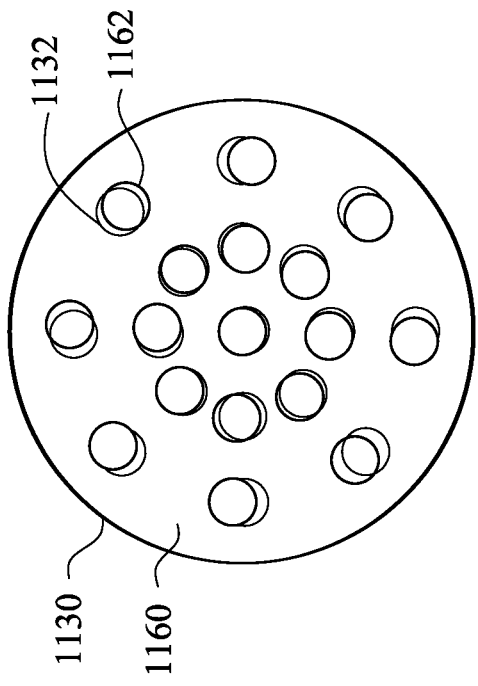
FIGS. 5A, 5B and 5C are schematic views of an overlapping amount of a base openings and a control openings with respect to a distributor opening according to various embodiments of the disclosure.
Figure 5A:
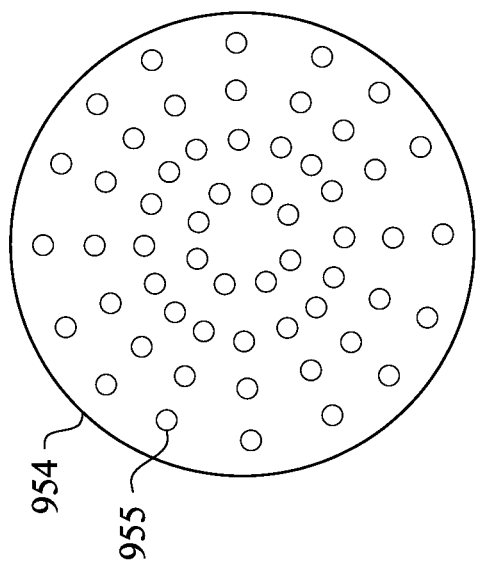
Figure 5C:
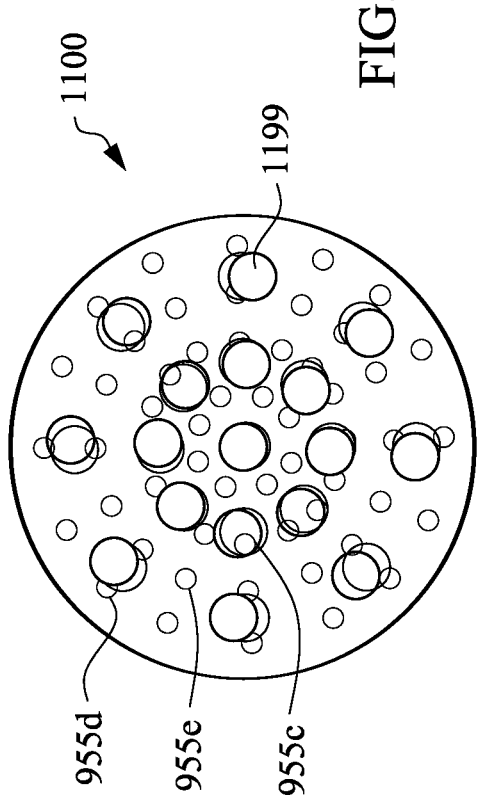

FIGS. 5A, 5B and 5C are schematic views of an overlapping amount of base openings in the base sheet 1130 and control openings in the control sheet 1160 according to various embodiments of the disclosure. As shown in FIGS. 5A, 5B and 5C, in some embodiments, the control openings 1162 of the plurality of control sheets 1160 and the base openings 1132 of the base sheet 1130 include the same diameter (or opening area), and a different diameter (or opening area) of the distributor opening 955 of the showerhead distributor 954. In such embodiments, the adjustable distributor assembly 1100 includes the plurality of control sheets 1160 that slidably mate with the base sheet 1130 on top of the showerhead distributor 954, such that an overlapping amount of the control openings 1162 of the plurality of control sheets 1160, the base openings 1132 of the base sheet 1130, and the distributor opening 955 of the showerhead distributor 954 is adjusted from 0% to 100%.

As shown in FIG. 5B, by adjusting the position of the plurality of control sheets 1160 relative to the base sheet 1130, the overlapping amount of the base openings 1132 and the control openings 1162 are adjusted from 0% to 100%, thereby adjusting an amount of gas passing through the adjustable distributor assembly 1100. For example, as shown in FIG. 5C, while the distributor opening 955c is fully open by the plurality of control sheets 1160 and the base sheet 1130, the distributor opening 955d is partially covered and the distributor opening 955e is fully closed, thereby the adjustable distributor assembly 1100 provides the selectively adjustable openings 1199 by an overlapping relationship between the plurality of control sheets and the base sheet. As shown in FIGS. 5A-5C, the plurality of control sheets 1160, the base sheet 1130 and the showerhead distributor 954 provide locally different gas amount flow towards the cleaning surface 998 of the substrate 999 (shown in FIG. 11). As such, in this configuration, a size of the distributor opening 955 of the showerhead distributor 954 affects the performance of the adjustable distributor assembly 1100.

Figure 6B:
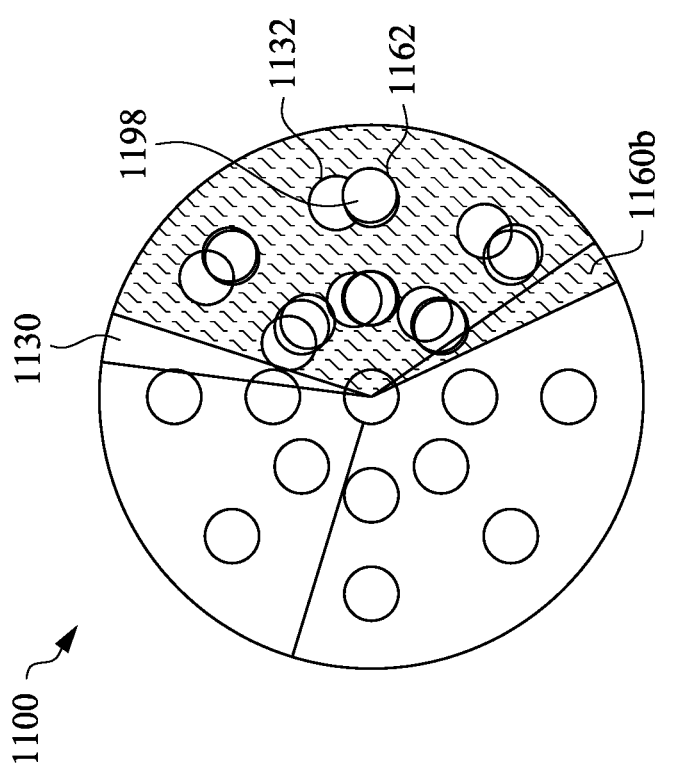
FIGS. 6A, 6B, 6C and 6D are schematic views of adjustable distributor assemblies for improving uniformity of the pre-clean operation according to various embodiments of the disclosure.
Figure 6B:
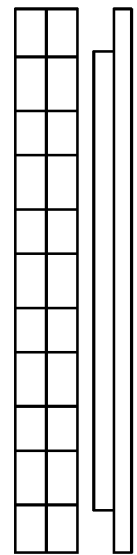

FIGS. 6A, 6B, 6C and 6D are schematic views of adjustable distributor assemblies for improving the uniformity of the pre-clean operation according to various embodiments of the disclosure. In some embodiments, as shown in the cross section of FIG. 6A, an etching rate of the right side of the wafer increases, causing a thinner remaining film 996. In such a case, as shown in FIG. 6B, some of the base openings 1132 located at the right side are partially or fully closed by the control sheets to reduce the etching gas flow (radical flow), thereby adjusting (reducing) the etching rate at the right side. For example, the adjustable distributor assembly 1100 rotates and/or moves a control sheet 1160b, so that the control openings 1162 of the plurality of control sheets 1160 slidably cover the base openings 1132 of the base sheet 1130 to provide selectively adjustable openings 1198. As a result, the adjustable distributor assembly 1100 provides a smaller amount of the pre-cleaning material directed towards the thinner remaining film 996 of the cleaning surface of the substrate, thereby improving the thickness uniformity of the remaining film on the substrate during the pre-clean operation. Accordingly, it is possible to balance the etching rates between the left regions and the right regions and thus obtain a uniform remaining film thickness, thereby improving the uniformity of the pre-clean operation.

In some embodiments, after pre-clean process, the etching amount (remaining thickness) is measured and when there is non-uniformity still remaining, the hole-overlapping amount is adjusted to increase or decrease the gas amount. In some embodiments, an in-situ monitoring of the etching amount and dynamic adjusting the overlapping amount of the base openings 1132 and the control openings 1162 is performed. In various embodiments, the shapes/locations of the plurality of control sheets 1160 with respect to the base sheet 1130 are adjusted to compensate for the thickness non-uniformity.

Figure 6A:
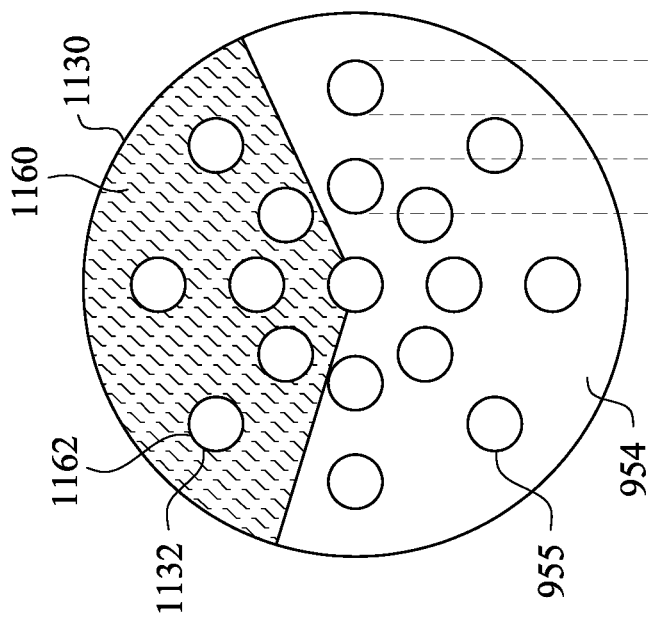
Figure 6A:
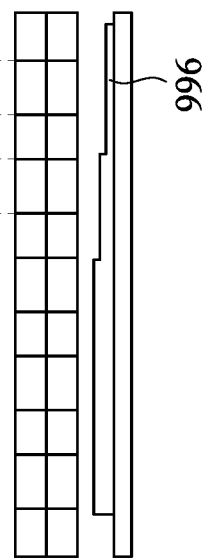
Figure 6D:
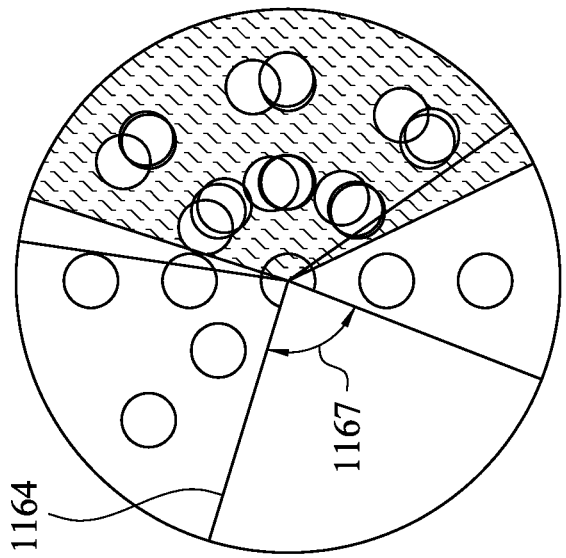
Figure 6D:
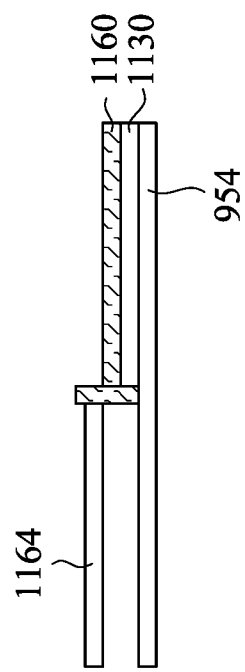
Figure 6C:
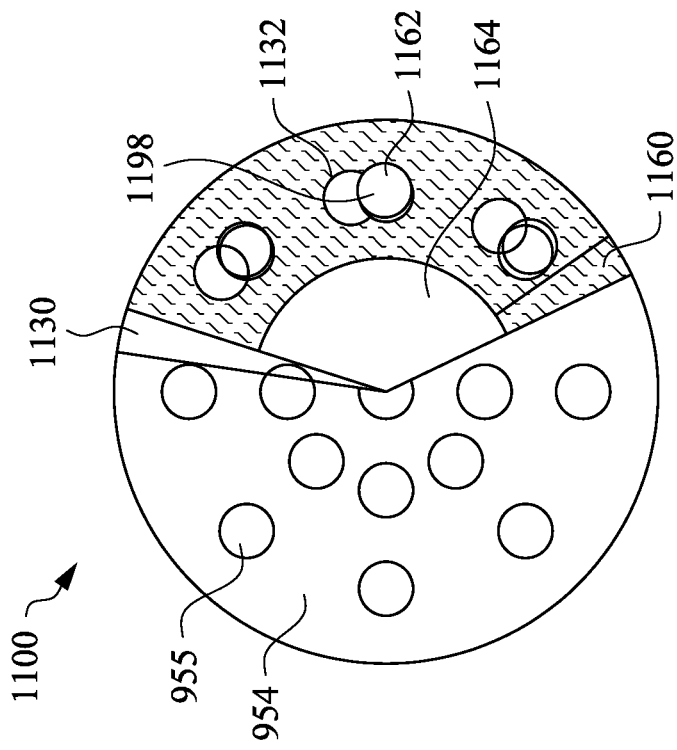
Figure 6C:
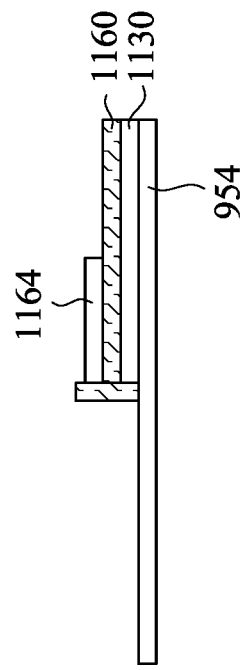

As shown in FIGS. 6C and 6D, in some embodiments, the adjustable distributor assembly 1100 further includes a covering sheet 1164. The covering sheet 1164 is configured to slidably mate with the base sheet 1130 and/or the plurality of control sheets 1160, such that the distributor opening 955 can be fully closed by the covering sheet 1164 when the combination of the control openings 1162 of the plurality of control sheets 1160 and the base openings 1132 of the base sheet 1130 cannot provide the selectively adjustable openings 1198. In some embodiments, as shown in FIG. 6C, a diameter of the covering sheet 1164 and the base sheet 1130 and/or the plurality of control sheets 1160 are different. In other embodiments, as shown in FIG. 6D, a diameter of the covering sheet 1164 and the base sheet 1130 and/or the plurality of control sheets 1160 are about the same. In some embodiments, an internal fan angle 1167 of the covering sheet 1164 ranges from 0 degree to 360 degrees.

Figure 7B:
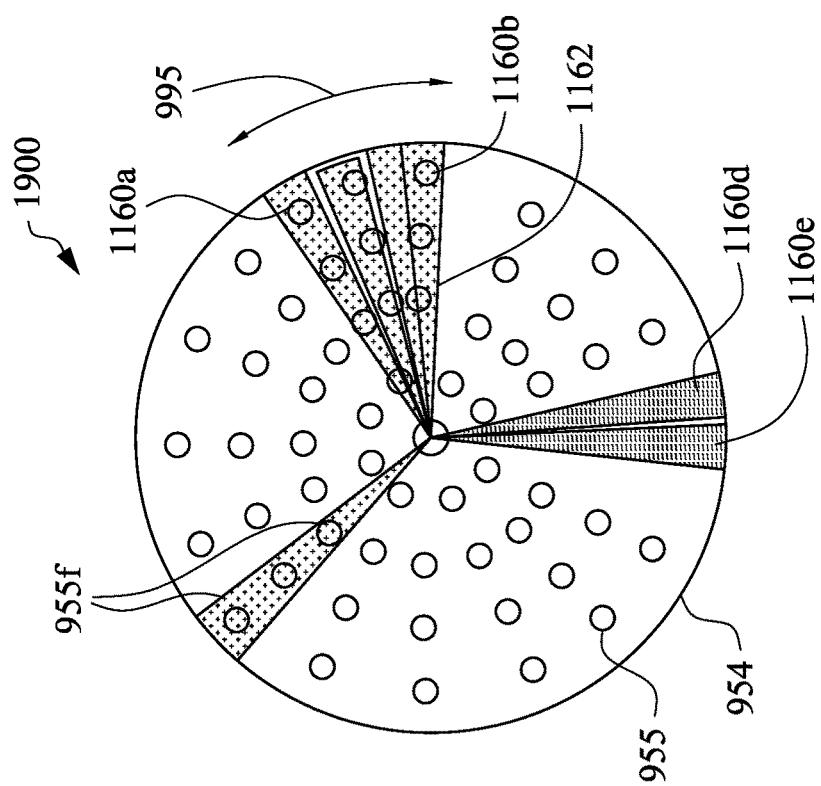
FIGS. 7A and 7B are schematic views of the adjustable distributor assembly including a plurality of control segments according to embodiments of the disclosure.
Figure 7A:
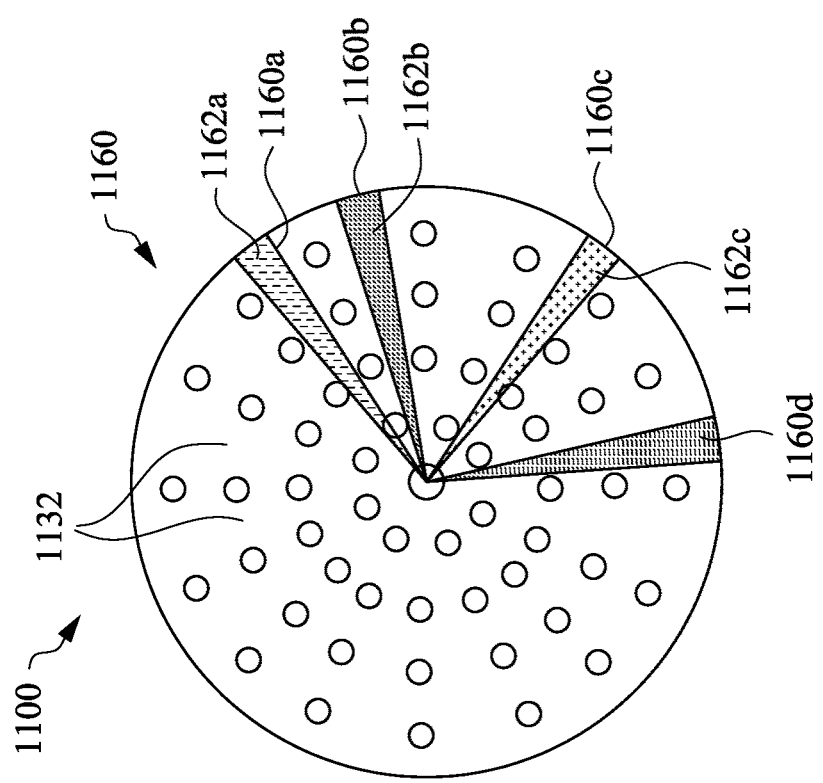

FIGS. 7A and 7B are schematic views of the adjustable distributor assembly including a plurality of control segments according to embodiments of the disclosure. In some embodiments, as shown in FIGS. 7A and 7B, the adjustable distributor assembly 1100 further includes a plurality of control segments 1160a, 1160b, and 1160c. In some embodiments, as shown in FIG. 7A, the plurality of control segments 1160a, 1160b, 1160c are positioned between the base openings 1132 of the base sheet 1130 during a normal situation, so that no base openings 1132 are covered by the plurality of control sheets (0% overlap). There is no base sheet 1130 used in FIGS. 7A-7B. As shown in FIG. 7B, when there is a need, the distributor opening 955f can be fully covered by the plurality of control segments, such as 1160c including a smaller diameter than that of the distributor opening 955f, thereby the adjustable distributor assembly provides the selectively adjustable openings by an overlapping relationship between the plurality of control sheets and the distributor opening 955 of the showerhead distributor 954. As shown in FIGS. 7A-7C, only the plurality of control segments 1160a, 1160b, 1160c provide locally different gas flow amounts towards the shower head distributor 954. As such, in this configuration, a size of base openings 1132 of the base sheet 1130 and the distributor opening 955 of the showerhead distributor 954 do not affect a performance of the adjustable distributor assembly 1100.

In some embodiments, as shown in FIG. 7A, each of the plurality of control segments 1160a, 1160b, 1160c includes the control openings 1162a, 1162b, 1162c that have a different diameter from each other. For example, a diameter of the control openings 1162a is about 0.3-0.7 mm, a diameter of the control openings 1162b is about 0.8-1.2 mm, and a diameter of the control openings 1162c is about 4-6 mm. In other embodiments, each of the plurality of control segments 1160d includes no control openings.

As shown in FIG. 7B, in some embodiments, two or more of the plurality of control segments 1160a 1160b and 1160c generate the selectively adjustable regions 1900 by partially closing the distributor opening 955 of the showerhead distributor 954 at the locations corresponding to, e.g., thinner remaining film region of the cleaning surface (shown in FIG. 6A). In some embodiments, the plurality of control sheets 1160d and 1160e generate the selectively adjustable regions 1900 by fully closing some of the base openings.

In some embodiments, the adjustable distributor assembly 1100 further includes a driving mechanism 1400 (shown in FIG. 11) to move the control sheets 1160. In some embodiments, the driving mechanism includes one or more motors, actuators (e.g., piezo actuators), gears, pistons, or any other suitable mechanism to slide and/or rotate the control sheets 1160. In some embodiments, the driving mechanism includes a controller coupled to a monitoring system (e.g., cameras, thickness measurement tools, etc.) to monitor an etching amount, and to control the positions of the control sheets 1160.

In some embodiments, the base sheet 1130 and the plurality of control sheets 1160 further include a mechanism to fan out when needed, and substantially concealed within the showerhead housing 956 (shown in FIG. 2) of the showerhead when not in use.

Figure 8B:
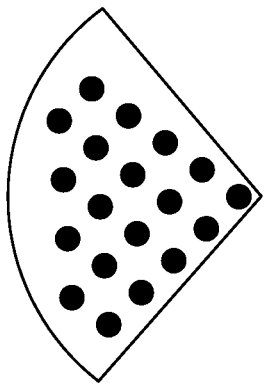
FIGS. 8A, 8B, 8C, 8D, 8E and 8F schematically illustrate the adjustable distributor assembly including the base openings and the control openings according to various embodiments of the disclosure.
Figure 8C:
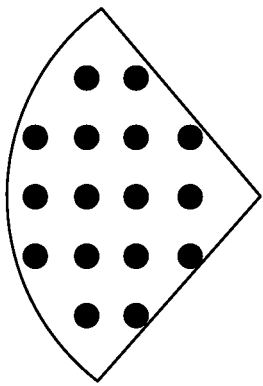
Figure 8D:
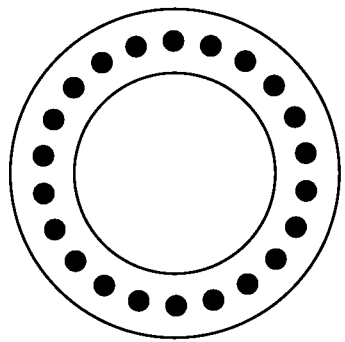
Figure 8A:
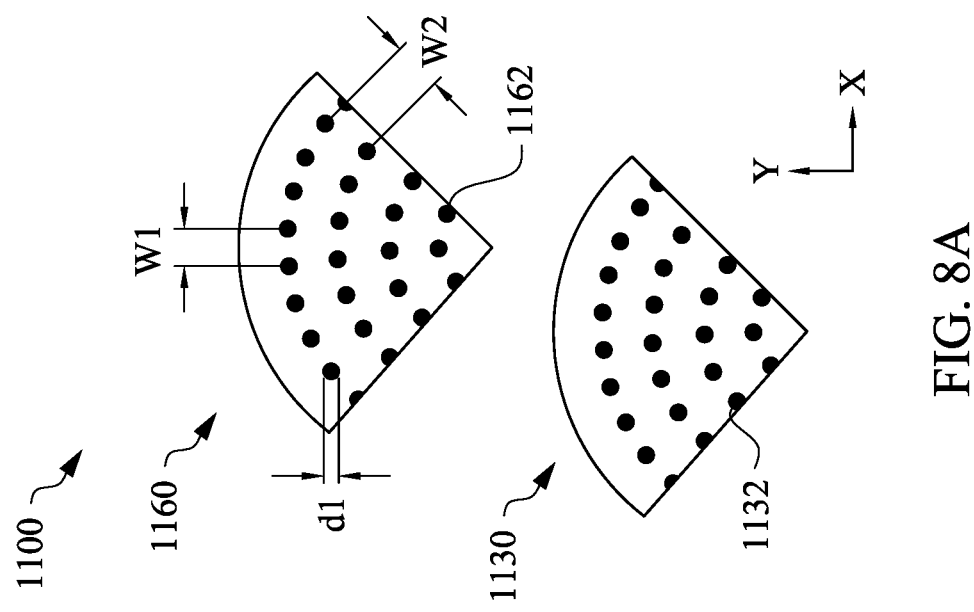

FIGS. 8A, 8B, 8C and 8D schematically illustrate the adjustable distributor assembly 1100 including the base sheet 1130 having the base openings 1132 and the control sheet 1160 having the control openings 1162 according to an embodiment of the disclosure. The base openings 1132 are disposed within the base sheet 1130, and the control openings 1162 are disposed within the plurality of control sheets 1160 through which the gas flows, as shown in FIGS. 8A-8D. As shown in FIG. 8A, in some embodiments, the base openings 1132 and/or the control openings 1162 are arranged in a concentric arrangement. In some embodiments, the control sheet 1160 has a full circular shape and in other embodiments, the control sheet 1160 has a fan shape, while the base sheet 1130 has a full circular shape (a circular plate or an annular shape as shown in FIG. 8D).

In some embodiments, each of the base openings 1132 and/or the control openings 1162 has a diameter d1 ranging from about 0.01 mm to about 1 mm. In some embodiments, each of the base openings 1132 and/or the control openings 1162 has a diameter d1 ranging from about 0.05 mm to about 0.5 mm. In some embodiments, the diameter d1 of the base openings 1132 and/or the control openings 1162 is about 0.1 mm to 0.3 mm. In some embodiments, the base openings 1132 and/or the control openings 1162 have an angular spacing w1, w2 along the angular direction and the radial direction ranging from about 0.5 mm to about 24 mm. In some embodiments, the base openings 1132 and/or the control openings 1162 have an angular spacing ranging from about 3 mm to about 10 mm. In some embodiments, the base openings 1132 and/or the control openings 1162 have an angular spacing of about 5-7 mm. In some embodiments, an angular spacing in the angular direction and the angular spacing in the radial direction are about the same. In other embodiments, an angular spacing in the angular direction and the radial direction are different.

Figure 8F:
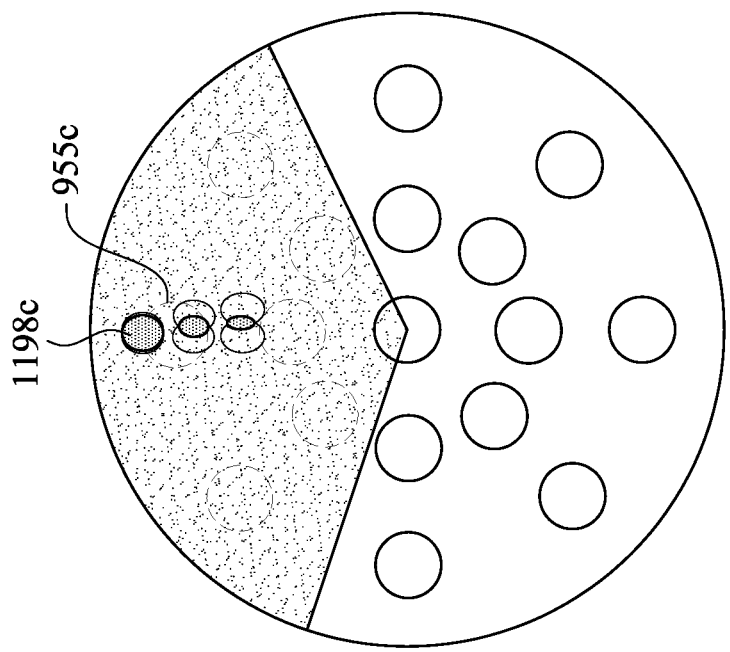
Figure 8E:
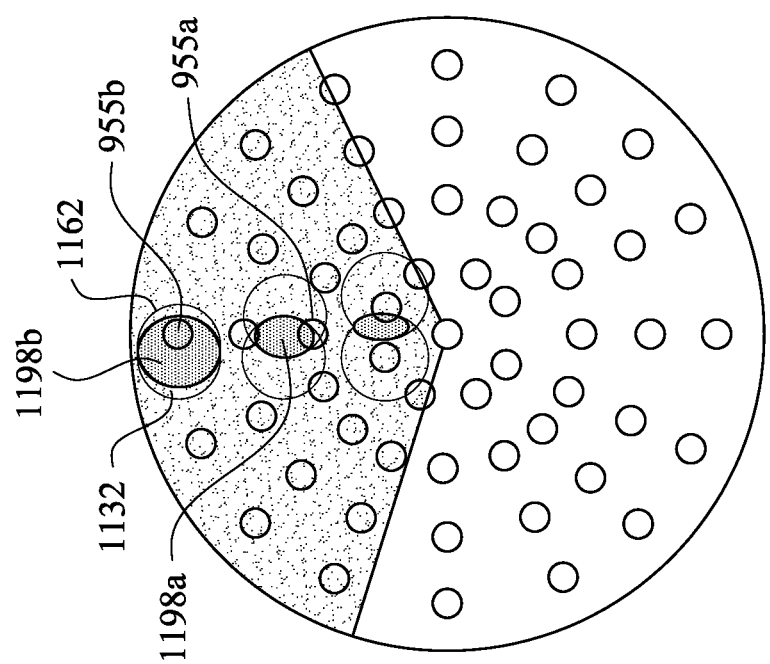

As shown in FIG. 8E, if the diameter of the base openings 1132 and/or the control openings 1162 is too large, the adjustable distributor assembly cannot provide selectively adjustable openings effectively. For example, while the overlapping amount 1198a adjusts an area of the distributor opening 955a, the overlapping amount 1198b does not adjust an area of the distributor opening 955b of the showerhead distributor. As shown in FIG. 8F, if the diameter of the base openings 1132 and/or the control openings 1162 is too small, the overlapping amount 1198c may adjust an area of the distributor opening 955c, but an overlapping amount of the base openings 1132 and the control openings 1162 cannot be adjusted all the way down to 0% of the distributor opening 955c of the showerhead distributor. In addition, the gas flow may become undesirably high.

In some embodiments, the adjustable distributor assembly 1100 includes various patterns of the base openings 1132 and/or the control openings 1162. In some embodiment, the base openings and/or the control openings are arranged in concentric circles surrounding a central opening, as shown in FIG. 8A. The patterns of the base openings 1132 and/or the control openings 1162 are not limited to the embodiments shown herein. As shown in FIGS. 8B-8C, in some embodiments, the base openings and/or the control openings are arranged in lines, where the base openings and/or the control openings in alternating lines are staggered relative to immediately adjacent lines. In other embodiments, other patterns, such as a spiral pattern, random pattern, etc. are within the scope of this disclosure.

Figure 9C:
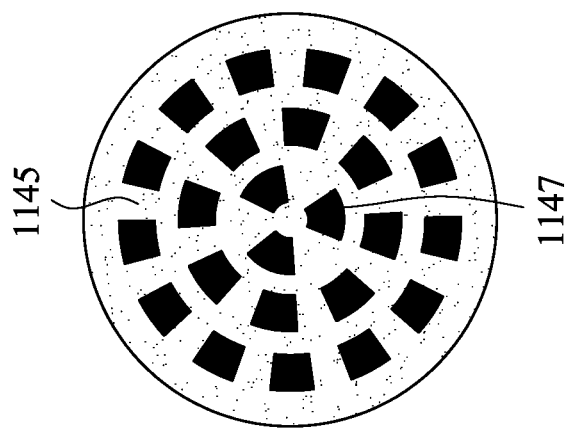
FIGS. 9A, 9B and 9C schematically illustrate the adjustable distributor assembly including the base sheet according to various embodiments of the disclosure.
Figure 9B:
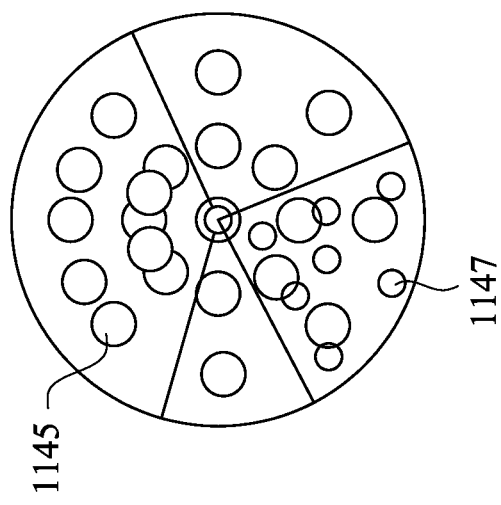
Figure 9A:
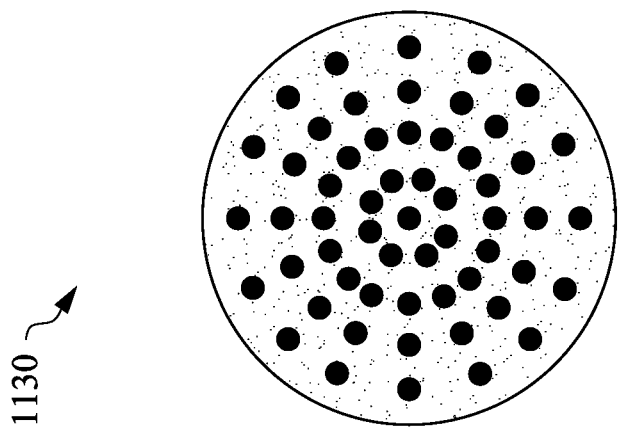

FIGS. 9A, 9B and 9C schematically illustrate the adjustable distributor assembly 1100 including the base sheet according to an embodiment of the disclosure. As shown in FIG. 9A, the base sheet 1130 has a symmetric hole distribution (concentric) to provide uniform etching. However, when the perfect uniformity cannot be obtained, local variations can be compensated by adjusting the opening/hole size by using control sheet by adjusting overlapping or closure amount. As shown in FIG. 9B, in some embodiments, the base sheet 1130 includes first openings 1145 and/or second openings 1147 that are configured to eject the cleaning material. In some embodiments, the first openings 1145 and the second openings 1147 have a different opening area. In such an embodiment, the first openings 1145 and the second openings 1147 have a different diameter. As shown in FIG. 9C, a shape of the first openings 1145 and the second openings 1147 are not particularly limited. For example, in an embodiment, the shape of the first openings 1145 and the second openings 1147 is a circle, an ellipse, a triangle, and a regular or irregular convex polygon. In some embodiments, the first openings 1145 and the second openings 1147 have a different shape. In some embodiments, the first openings 1145 and the second openings 1147 have the same shape, as shown in FIGS. 9A and 9B. In some embodiments, no first opening is provided (closed) in the base sheet 1130, and in other embodiments, no second opening is provided (closed) in the base sheet 1130.

Figure 10C:
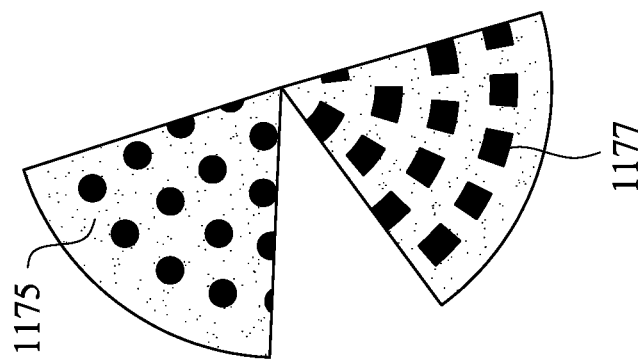
FIGS. 10A, 10B and 10C schematically illustrate the adjustable distributor assembly including the plurality of control sheets according to various embodiments of the disclosure.
Figure 10B:
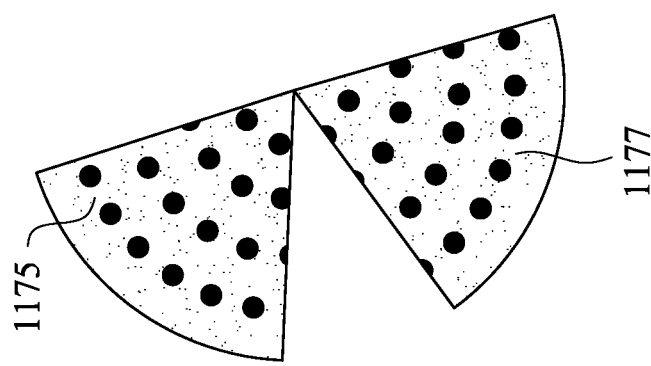
Figure 10A:
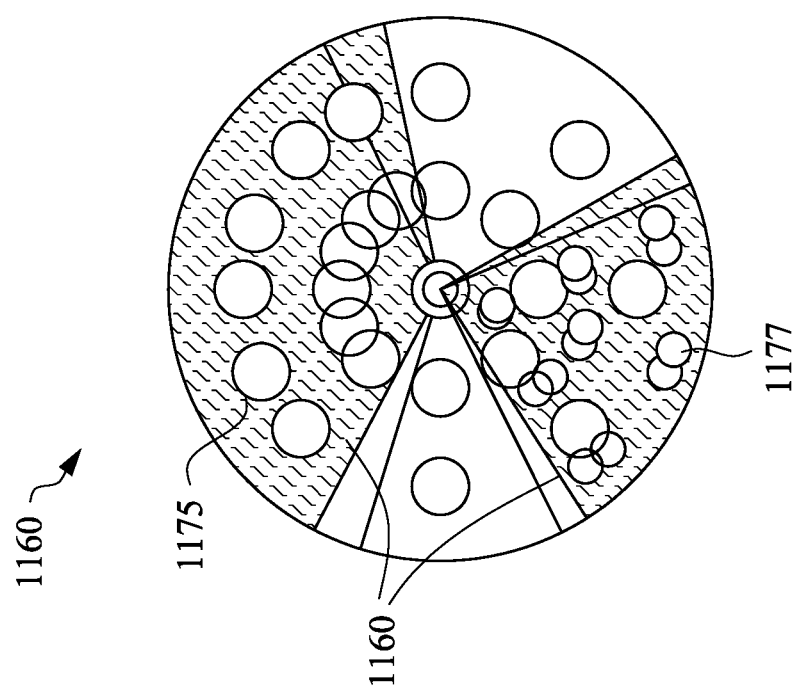

FIGS. 10A, 10B and 10C schematically illustrate the adjustable distributor assembly including the plurality of control sheets according to an embodiment of the disclosure. The plurality of control sheets 1160 includes third openings 1175 and/or fourth openings 1177 that are configured to eject the cleaning material. As shown in FIG. 10A, in some embodiments, the third openings 1175 and the fourth openings 1177 have a different diameter. As shown in FIG. 10B, in some embodiments, the third openings 1175 and the fourth openings 1177 have the same diameter. The shape of the third openings 1175 and/or the fourth openings 1177 are not particularly limited. For example, in an embodiment, the shape of the third openings 1175 and/or the fourth openings 1177 is a circle, an ellipse, a triangle, and a regular or irregular convex polygon. In some embodiments, the third openings 1175 and the fourth openings 1177 have a different shape, as shown in FIG. 10C. In some embodiments, the third openings 1175 and the fourth openings 1177 have the same shape, as shown in FIGS. 10A and 10B.

In some embodiments, the plurality of control sheets 1160 is fixedly attached or integrated with the base sheet 1130. In alternative embodiments, the plurality of control sheets 1160 is detachable from the base sheet 1130.

The adjustable distributor assembly 1100, according to embodiments of the disclosure, is made of at least one of quartz, polyethylene (PE) and polytetrafluoroethylene (PTFE).

Figure 11:
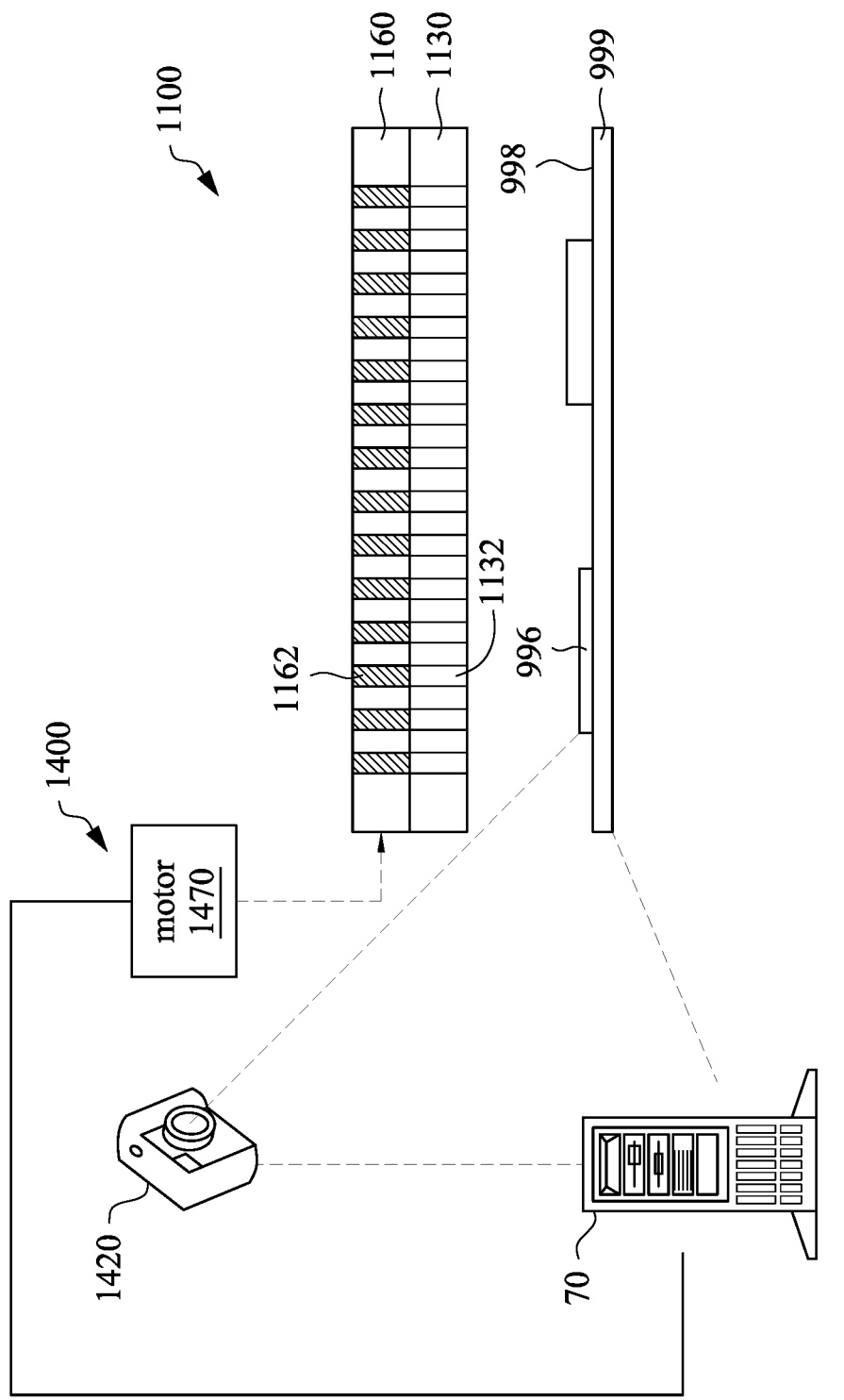
FIG. 11 schematically illustrates a controllable pre-cleaning operation according to an embodiment of the disclosure.

FIG. 11 schematically illustrates a controllable pre-cleaning operation according to an embodiment of the disclosure. In some embodiments, the controllable pre-cleaning operation is triggered based on monitored and sensed polymeric residues and/or metal oxide deposits, such as copper oxide.

As shown in FIG. 11, in some embodiments, a controller 70 is configured to monitor an amount/thickness of a layer including polymeric residues and/or metal oxide deposits, such as copper oxide, at the cleaning surface 998 of the substrate 999. In some embodiments, the base sheet 1130 and the plurality of control sheets 1160 is coupled to a moving and supporting mechanism and is connected to supporting devices such as a motor 1470. By using a monitoring device 1420, the controller 70 adjusts configurable parameters when the amount/thickness of the layer removed during the pre-clean operation of the cleaning surface 998 is more than a threshold amount or greater than a threshold thickness/size, and regulates the configurable parameters of the adjustable distributor assembly 1100, an overlapping amount of the base openings 1132 and the control openings 1162 that can be locally adjusted from 0% to 100%, and an angular overlapping amount of the base openings 1132 and the control openings 1162 that can be extended from 0 degree to 360 degrees by operating the motor 1470. In such embodiments, the controllable pre-clean operation includes configurable parameters that include one or more of an area of openings, a type/shape of openings, a region of openings, a type of gas/fluids, a flow rate or pressure, a gas/liquid temperature, and/or a showerhead height with respect to the cleaning surface 998 of the substrate 999, etc. The configurable parameters of the controllable pre-clean operation, according to some embodiments, further include control parameters to control the supporting devices, such as a motor 1470, a turbo pump and a pendulum valve. In some embodiments, the monitoring device 1420 is a camera. In some embodiments, the monitoring device 1420 includes an image process unit/algorithm using the camera. In some embodiments, the ejection of the pre-cleaning material from the adjustable distributor assembly 1100 is stopped when the monitoring device detects the amount of the polymeric residues and/or metal oxide deposits, such as copper oxide, on the cleaning surface 998 of the substrate 999 is below the threshold amount. Any appropriate controlling configuration regarding automatic and/or manual operation is contemplated and is not limited in this regard.

As shown in FIG. 11, in response to a measurement of a lower thickness 996 of a film, some of the base openings and control openings located at the measured portion are partially or fully closed by the control sheets to reduce the etching gas flow (radical flow), thereby adjusting (reducing) the etching rate at the measured portion. For example, the adjustable distributor assembly 1100 rotates and/or moves a control sheet, so that the control openings 1162 of the plurality of control sheets 1160 slidably cover the base openings 1132 of the base sheet 1130 to provide selectively adjustable openings. As a result, the adjustable distributor assembly 1100 provides the smaller amount of the pre-cleaning material directed towards the thinner remaining film 996 of the cleaning surface of the substrate, thereby improving the thickness uniformity of the remaining film on the substrate during the pre-clean operation.

In some embodiments, the polymeric residues are analyzed by scanning electron microscopy (SEM). In other embodiments, the polymeric residues are analyzed by energy dispersive X-ray spectroscopy (EDX), total reflection X-ray fluorescence (TXRF) and/or any suitable method of elemental analysis. In some embodiments, the method further includes identifying a source of the polymeric residues and/or metal oxide deposits, such as copper oxide, based on the analysis. In other embodiments, the method further includes counting a number of polymeric residues before the pre-clean operation. In some alternative embodiments, the method further includes counting a number of polymeric residues after the pre-clean operation.

Figure 12:
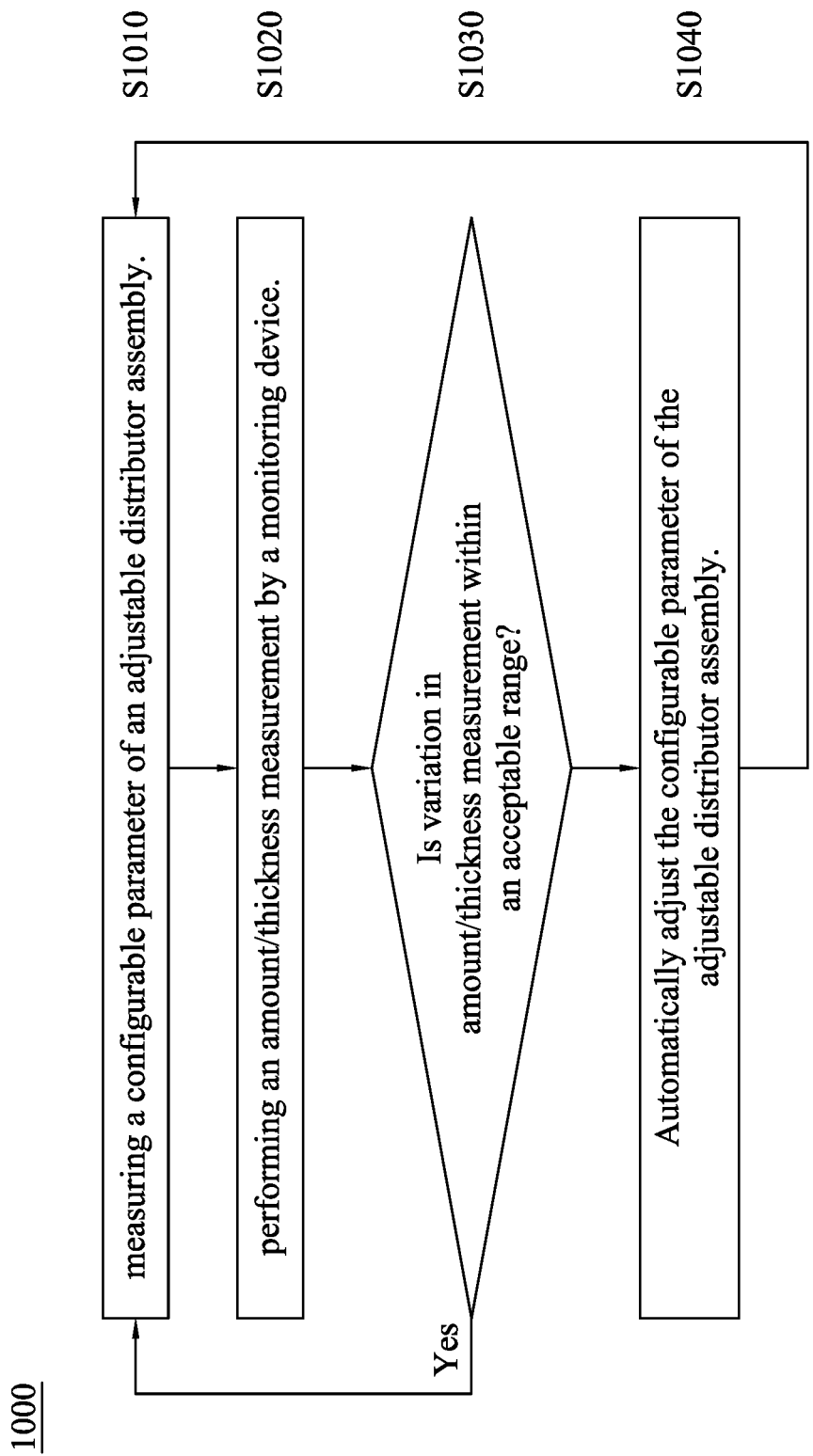
FIG. 12 illustrates a flow-chart of a method of using a showerhead assembly, in accordance with an embodiment of the present disclosure.

FIG. 12 illustrates a flow-chart of a method 1000 of using the showerhead assembly with the feedback control operation, in accordance with an embodiment of the present disclosure.

In some embodiments, a showerhead is disposed over a wafer within a cleaning chamber, in which the showerhead configured to eject cleaning material through the showerhead toward a cleaning surface of the wafer. The adjustable distributor assembly is placed within a showerhead and is configured to provide selectively adjustable openings through which the cleaning material passes. In some embodiments, the adjustable distributor assembly includes a base sheet including base openings and a plurality of control sheets including control openings and configured to slidably mate with the base sheet to provide selectively adjustable openings.

The method includes, at S1010, determining an initial value of a configurable parameter of an adjustable distributor assembly. In some embodiments, the configurable parameter includes an overlapping amount of the base openings and the control openings that can be adjusted from 0% to 100%, and an angular overlapping amount of the base openings and the control openings that can be extended from 0 degree to 360 degrees.

At S1020, a measurement of amount/thickness of the layer removed during the pre-clean operation of the cleaning surface is performed by a monitoring device to determine if the amount/thickness of the layer removed during the pre-clean operation of the cleaning surface 998 is more than a threshold amount or greater than a threshold thickness/size.

At S1030, it is determined whether a variation in the amount/thickness measurement of the layer removed during the pre-clean operation is within an acceptable range. In some embodiments, the monitoring device includes a logic circuit programmed to generate a predetermined signal when the detected variation in amount/thickness measurement is not within an acceptable range. For example, a signal is generated when the detected variation in amount/thickness measurement is less than a certain threshold value.

Then, at S1040, an overlapping amount of the base openings and the control openings is automatically adjusted according to the monitoring results. In some embodiments, the adjustable distributor assembly rotates and/or moves a plurality of control sheets, so that the control openings of the plurality of control sheets slidably cover the base openings of the base sheet to provide the overlapping amount between 0% and 100% to one or more areas where the remaining thickness is more than the threshold. In other embodiments, the adjustable distributor assembly rotates and/or moves a plurality of control sheets, such that an angular overlapping amount of the base openings and the control openings is extended between 0 degree and 360 degrees. As a result, the adjustable distributor assembly 1100 provides a smaller amount of the pre-cleaning material directed towards a selected/localized area/regions of the cleaning surface of the substrate, thereby improving the thickness uniformity of the remaining film on the substrate during the pre-clean operation. In other embodiments, by adjusting the positions of the control sheets, the amount of the pre-cleaning material is locally increased.

Figure 13B:
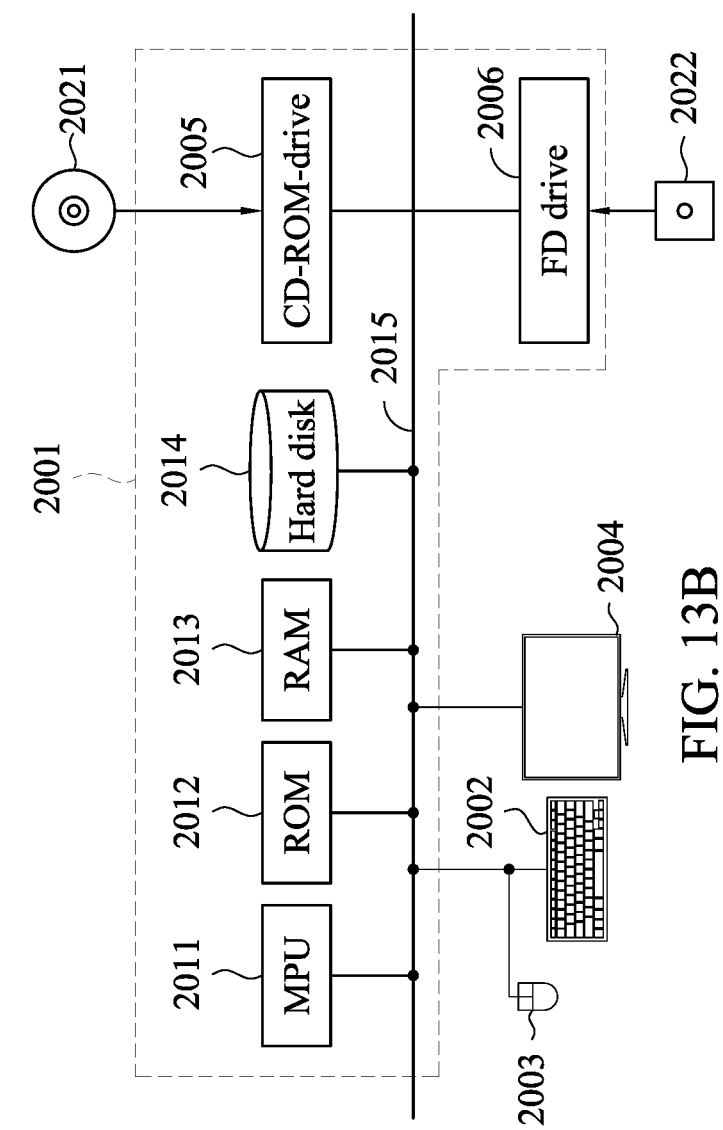
FIGS. 13A and 13B illustrate a controller in accordance with some embodiments of the disclosure.
Figure 13A:
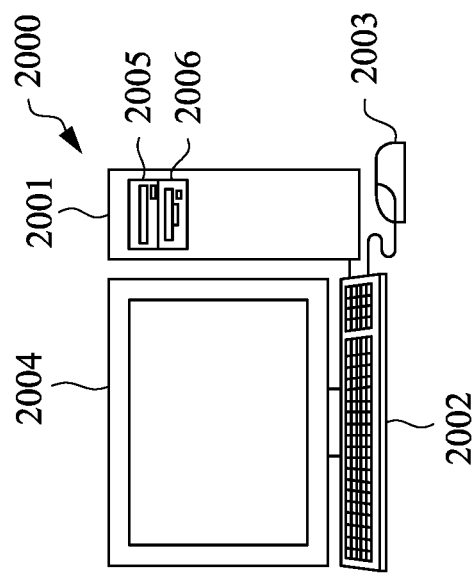

FIGS. 13A and 13B illustrate a configuration of the controller 70 in accordance with some embodiments of the disclosure. In some embodiments, a computer system 2000 is used as the controller 70. In some embodiments, the computer system 2000 performs the functions of the controller as set forth above.

FIG. 13A is a schematic view of a computer system. All of or a part of the processes, method and/or operations of the foregoing embodiments can be realized using computer hardware and computer programs executed thereon. In FIG. 13A, a computer system 2000 is provided with a computer 2001 including an optical disk read only memory (e.g., CD-ROM or DVD-ROM) drive 2005 and a magnetic disk drive 2006, a keyboard 2002, a mouse 2003, and a monitor 2004.

FIG. 13B is a diagram showing an internal configuration of the computer system 2000. In FIG. 13B, the computer 2001 is provided with, in addition to the optical disk drive 2005 and the magnetic disk drive 2006, one or more processors, such as a micro processing unit (MPU) 2011, a ROM 2012 in which a program such as a boot up program is stored, a random access memory (RAM) 2013 that is connected to the MPU 2011 and in which a command of an application program is temporarily stored and a temporary storage area is provided, a hard disk 2014 in which an application program, a system program, and data are stored, and a bus 2015 that connects the MPU 2011, the ROM 2012, and the like. Note that the computer 2001 may include a network card (not shown) for providing a connection to a LAN.

The program for causing the computer system 2000 to execute the functions of an apparatus for controlling the apparatus in the foregoing embodiments may be stored in an optical disk 2021 or a magnetic disk 2022, which are inserted into the optical disk drive 2005 or the magnetic disk drive 2006, and transmitted to the hard disk 2014. Alternatively, the program may be transmitted via a network (not shown) to the computer 2001 and stored in the hard disk 2014. At the time of execution, the program is loaded into the RAM 2013. The program may be loaded from the optical disk 2021 or the magnetic disk 2022, or directly from a network. The program does not necessarily have to include, for example, an operating system (OS) or a third party program to cause the computer 2001 to execute the functions of the controller 70 in the foregoing embodiments. The program may only include a command portion to call an appropriate function (module) in a controlled mode and obtain desired results.

Embodiments of the present disclosure minimize polymeric residues and metal oxide deposits, such as copper oxide, and provide improved thickness uniformity of the substrate during the pre-clean operation. Higher yield of semiconductor devices and higher quality semiconductor devices are obtained from methods according to the present disclosure. Embodiments of the present disclosure enable the use of a standalone track processing configuration and enables the processing of wafers at higher wafer throughput and improves processing configuration flexibility. Embodiments of the present disclosure further provide the benefit of reducing downtime during maintenance and servicing photolithographic tools and masks. The design of the pre-clean system and showerhead assembly allows for faster maintenance with reduced servicing time. The adaptation of the pre-clean system allows an improved process resulting in reduced manpower required to perform the maintenance, and an increased output of conforming servicing items of the photolithographic tools—both of which ultimately result in a cost-savings. As such, the photolithographic tools and masks are more efficiently used. However, it will be understood that not all advantages have been necessarily discussed herein, no particular advantage is required for all embodiments or examples, and other embodiments or examples may offer different advantages.

An embodiment of the disclosure is a device for cleaning a wafer in a semiconductor manufacturing apparatus that includes a showerhead and an adjustable distributor assembly. The showerhead is disposed over a wafer stage within a cleaning chamber and configured to eject cleaning material through the showerhead towards a cleaning surface of a wafer. The adjustable distributor assembly is disposed within the showerhead through which the cleaning material passes. The adjustable distributor assembly includes a base sheet and a plurality of control sheets. The base sheet includes base openings, and the plurality of control sheets include control openings and are configured to slidably mate with the base sheet to provide selectively adjustable openings.

In some embodiments, the selectively adjustable openings includes an adjustable opening size. In some embodiments, the adjustable distributor assembly further includes a plurality of control segments positioned between the base openings of the base sheet. In some embodiments, the adjustable distributor assembly further includes a sheet adapter configured to slidably attach the plurality of control sheets to the base sheet. In some embodiments, each of the plurality of control sheets is rotatably coupled to the sheet adapter at a pivot point of the plurality of control sheets. In some embodiments, hydrogen radicals pass through the showerhead to reduce metal oxide deposits on the wafer. In some embodiments, the control openings of the plurality of control sheets include first openings and second openings that have different opening areas. In some embodiments, the base openings and the control openings are arranged in a concentric arrangement. In some embodiments, a shape of the base and control openings includes at least one of a circle, an ellipse, a triangle, and a regular or irregular convex polygon. In some embodiments, the adjustable distributor assembly further includes a covering sheet without openings.

An embodiment of the disclosure is an apparatus for cleaning a wafer that includes a showerhead and an adjustable distributor assembly. The showerhead is disposed over a wafer stage within a cleaning chamber and configured to eject cleaning material through the showerhead towards a cleaning surface of a wafer. The adjustable distributor assembly disposed within the showerhead and configured to provide selectively adjustable openings through which the cleaning material passes. The adjustable distributor assembly includes a base sheet and a plurality of control sheets. The base sheet includes base openings, the plurality of control sheets and a feedback controller. The plurality of control sheets include control openings and are configured to slidably mate with the base sheet to provide selectively adjustable openings. The feedback controller is configured to adjust the selectively adjustable openings of the adjustable distributor assembly.

In some embodiments, the adjustable distributor assembly is made of at least one of quartz, polyethylene (PE) and polytetrafluoroethylene (PTFE). In some embodiments, the apparatus further includes a plurality of control segments positioned between the base openings of the base sheet. In some embodiments, the base sheet is a circular plate.

According to another aspect of the present disclosure, a method of controlling a feedback control operation of a showerhead disposed over a wafer within a cleaning chamber. In such embodiments, an adjustable distributor assembly is disposed within the showerhead configured to provide selectively adjustable openings through which a cleaning material passes is provided. The adjustable distributor assembly includes a base sheet and a plurality of control sheets. The base sheet includes base openings. The plurality of control sheets includes control openings and are configured to slidably mate with the base sheet to provide selectively adjustable openings. The method includes determining an initial value of a configurable parameter of an adjustable distributor assembly. Then, an amount/thickness measurement of a layer including polymeric residues and metal oxide deposits at a cleaning surface of the wafer is performed by a monitoring device. Subsequently, it is determined whether a variation in an amount/thickness measurement is within an acceptable range. In response to a variation in the amount/thickness measurement that is not within the acceptable range of variation in the amount/thickness measurement, the configurable parameter of the adjustable distributor assembly is automatically adjusted to set the variation in amount/thickness measurement within the acceptable range so that the cleaning material that passes through the selectively adjustable openings of the adjustable distributor assembly reduces metal oxide deposits.

In some embodiments, the configurable parameter includes one or more of an area of openings, a shape of openings, a region of openings, a type of gas, a flow rate or pressure, a gas/liquid temperature, and/or a showerhead height with respect to the cleaning surface of the wafer. In some embodiments, plasma is generated within a remote plasma source that does not enter into a cleaning chamber. In some embodiments, hydrogen radicals is reactivated by the plasma generated within the remote plasma source. In some embodiments, the hydrogen radicals pass through an applicator tube into the cleaning chamber. In some embodiments, the hydrogen radicals pass through the showerhead to remove polymeric residues on the wafer.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing an adjustable distributor assembly disposed within a showerhead configured to provide selectively adjustable openings through which a cleaning material passes, wherein the adjustable distributor assembly comprises:
a base sheet including base openings;

a plurality of control sheets including control openings and configured to slidably mate with the base sheet to provide selectively adjustable openings; and a plurality of control segments positioned between the base openings of the base sheet, wherein each of the plurality of control segments includes control openings that have a different diameter from each other;

determining an initial value of a configurable parameter of an adjustable distributor assembly;

performing an amount/thickness measurement of a layer including polymeric residues and metal oxide deposits at a cleaning surface of a wafer by a monitoring device;

determining whether a variation in the amount/thickness measurement is within an acceptable range; and in response to the variation in the amount/thickness measurement that is not within the acceptable range, automatically adjusting the configurable parameter of the adjustable distributor assembly to set the variation in the amount/thickness measurement within the acceptable range so that the cleaning material that passes through the selectively adjustable openings of the adjustable distributor assembly reduces metal oxide deposits.

2. The method of claim 1, wherein the configurable parameter includes one or more of an area of openings, a shape of openings, a region of openings, a type of gas, a flow rate or pressure, a gas/liquid temperature, and/or a showerhead height with respect to the cleaning surface of the wafer.

3. The method of claim 2, further including:
generating plasma within a remote plasma source that does not enter into a cleaning chamber.

4. The method of claim 3, further including:
reactivating hydrogen radicals by the plasma generated within the remote plasma source.

5. The method of claim 4, further including:
passing the hydrogen radicals through an applicator tube into the cleaning chamber.

6. The method of claim 5, further including:
passing the hydrogen radicals through the showerhead to remove polymeric residues on the wafer.

7. A method, comprising:
determining an initial value of a configurable parameter of an adjustable distributor assembly;
removing a layer at a cleaning surface of a substrate by a cleaning material which passes through a showerhead;
performing a measurement to determine if an amount of the layer removed is more than a threshold amount; and
determining whether a variation in the amount of the layer removed is within an acceptable range,
wherein the adjustable distributor assembly is disposed within the showerhead through which the cleaning material passes, the adjustable distributor assembly comprising:
a base sheet including base openings; and
a plurality of control sheets including control openings and configured to slidably mate with the base sheet to provide selectively adjustable openings,
wherein a plurality of control segments are positioned between the base openings of the base sheet, and
wherein each of the plurality of control segments includes control openings that have a different diameter from each other.

8. The method of claim 7, wherein the configurable parameter includes an overlapping amount of the base openings and the control openings that is adjustable from 0% to 100%, and an angular overlapping amount of the base openings and the control openings that is from 0 degree to 360 degrees.

9. The method of claim 7, wherein the performing a measurement to determine if an amount of the layer removed is more than a threshold amount is performed by a monitor device.

10. The method of claim 9, further comprising:
generating a signal when the variation in the amount of the layer is not within the acceptable range.

11. The method of claim 7, further comprising:
in response to the variation in the amount of the layer removed that is not within the acceptable range, adjusting the configurable parameter of the adjustable distributor assembly to set the variation in the amount of the layer removed is within the acceptable range.

12. The method of claim 11, further comprising:
activating the cleaning material by a remote plasma source.

13. The method of claim 7, wherein the cleaning material includes at least one of helium gas, $H_2O$, argon gas, and hydrogen gas.

14. A method for cleaning a wafer, comprising:
providing an activated cleaning material into a chamber through a showerhead onto a cleaning surface of a wafer, wherein an adjustable distributor assembly is disposed within the showerhead to provide selectively adjustable openings through which the activated cleaning material passes, wherein the adjustable distributor assembly comprises:
a base sheet including base openings; and
a plurality of control sheets including control openings and configured to slidably mate with the base sheet to provide selectively adjustable openings,
wherein a plurality of control segments is positioned between the base openings of the base sheet, and
wherein each of the plurality of control segments includes control openings that have a different diameter from each other.

15. The method of claim 14, wherein the activated cleaning material is activated by a remote plasma source.

16. The method of claim 14, further comprising:
adjusting a position of the plurality of control sheets relative to the base sheet to adjust an amount of the activated cleaning material passing through the adjustable distributor assembly.

17. The method of claim 16, further comprising:
moving the plurality of control sheets by a driving mechanism.

18. The method of claim 14, further comprising:
monitoring an amount of a layer including polymeric residues and/or metal oxide deposits at the cleaning surface of the wafer.

19. The method of claim 18, further comprising:
stopping providing the activated cleaning material when the amount of the layer including polymeric residues and/or metal oxide deposits at the cleaning surface of the wafer is below a threshold amount.

20. The method of claim 1, further comprising:
adjusting a position of the plurality of control sheets relative to the base sheet to adjust an amount of the cleaning material passing through the adjustable distributor assembly.

\* \* \* \* \*